United States Patent
Veendrick et al.

(10) Patent No.: US 7,928,882 B2
(45) Date of Patent: Apr. 19, 2011

(54) MONITORING PHYSICAL OPERATING PARAMETERS OF AN INTEGRATED CIRCUIT

(75) Inventors: Hendricus J M Veendrick, Heeze (NL); Marcel Pelgrom, Helmond (NL); Violeta Petrescu, Vosselaar (BE)

(73) Assignee: NXP B.V., Eindhoven (NL)

( * ) Notice: Subject to any disclaimer, the term of this patent is extended or adjusted under 35 U.S.C. 154(b) by 160 days.

(21) Appl. No.: 11/720,190

(22) PCT Filed: Nov. 7, 2005

(86) PCT No.: PCT/IB2005/053644
§ 371 (c)(1),
(2), (4) Date: May 24, 2007

(87) PCT Pub. No.: WO2006/005898
PCT Pub. Date: Jun. 1, 2006

(65) Prior Publication Data
US 2008/0007246 A1 Jan. 10, 2008

(30) Foreign Application Priority Data

Nov. 24, 2004 (GB) .................................. 0425800.0

(51) Int. Cl.
*H03M 1/12* (2006.01)
*H03M 1/34* (2006.01)
(52) U.S. Cl. .......................... 341/155; 341/163; 341/164
(58) Field of Classification Search .................... 700/21; 341/163, 164, 155; 716/1, 6
See application file for complete search history.

(56) References Cited

U.S. PATENT DOCUMENTS

| | | | | |
|---|---|---|---|---|
| 3,838,396 A | * | 9/1974 | Martin | 711/109 |
| 4,490,713 A | * | 12/1984 | Mrozowski et al. | 341/163 |
| 4,771,396 A | * | 9/1988 | South et al. | 708/319 |
| 4,839,650 A | * | 6/1989 | Geen et al. | 341/118 |
| 5,978,746 A | * | 11/1999 | Beneteau et al. | 702/128 |
| 6,353,324 B1 | * | 3/2002 | Uber et al. | 324/457 |
| 6,424,900 B2 | * | 7/2002 | Murray et al. | 701/48 |
| 6,747,588 B1 | * | 6/2004 | Huang et al. | 341/156 |
| 6,901,355 B2 | * | 5/2005 | Opitz et al. | 702/190 |
| 7,092,833 B2 | * | 8/2006 | Hrubes et al. | 702/86 |
| 2004/0128115 A1 | | 7/2004 | Chen et al. | |
| 2007/0115024 A1 | * | 5/2007 | Goetting et al. | 326/9 |

FOREIGN PATENT DOCUMENTS

| | | |
|---|---|---|
| EP | 0647905 B1 | 4/1995 |
| WO | WO/2004/068156 A1 | 8/2004 |

* cited by examiner

*Primary Examiner* — Albert Decady
*Assistant Examiner* — Tom Stevens

(57) ABSTRACT

An integrated circuit comprises a plurality of sensing circuits (12), each for detecting whether a respective physical operating parameter is above or below a respective reference value. The integrated circuit contains a serial shift register (11) for shifting digital data signals that represent the respective reference values from a successive approximation update circuit (14) to the sensing circuits (12) and back to the successive approximation update circuit (14). Detection results of the sensing circuits (12) are shifted to the successive approximation update circuit (14) with the digital data signals. The successive approximation update circuit (14) is used to form the digital data so that the reference values form successive approximations of the physical operating parameter values during an analog to digital conversion process. In this way the successive approximation update circuit (14) is shared by a plurality of sensing circuits (12).

16 Claims, 3 Drawing Sheets

INTEGRATED CIRCUIT

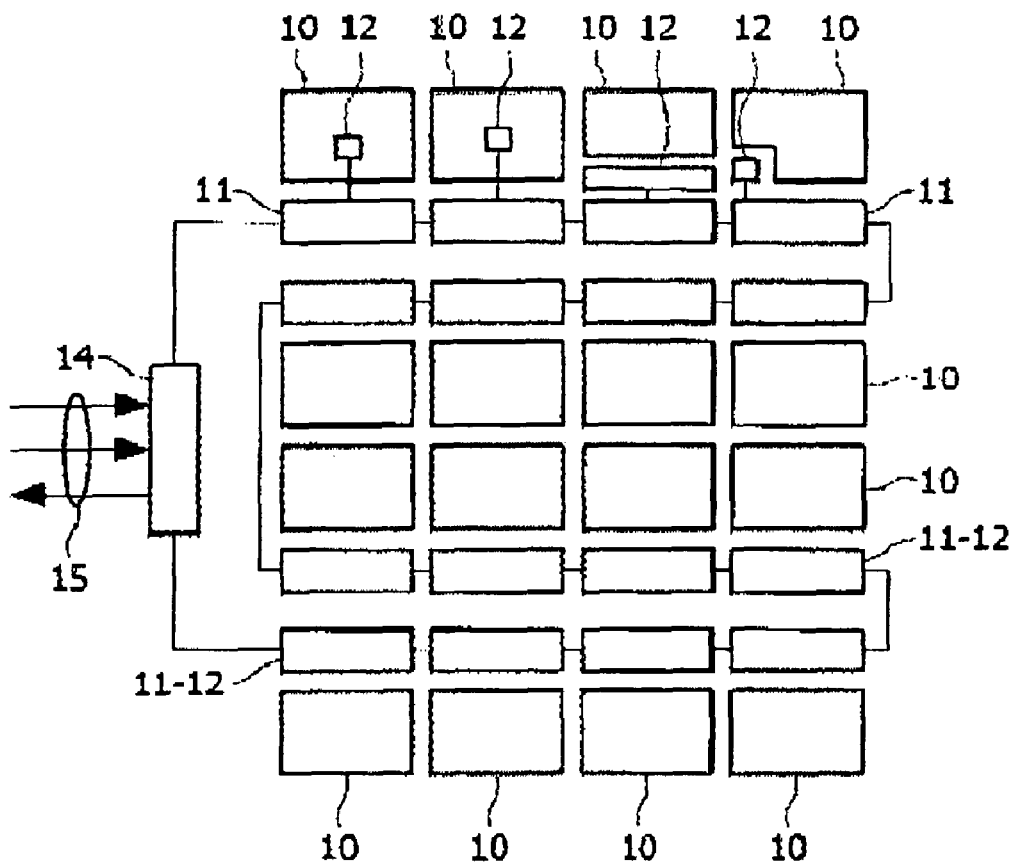
FIG. 1 INTEGRATED CIRCUIT
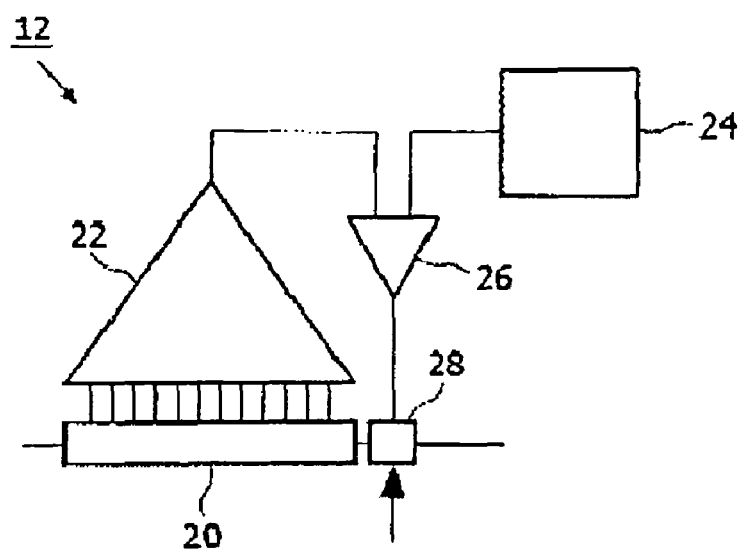
FIG. 2 SENSING CIRCUIT

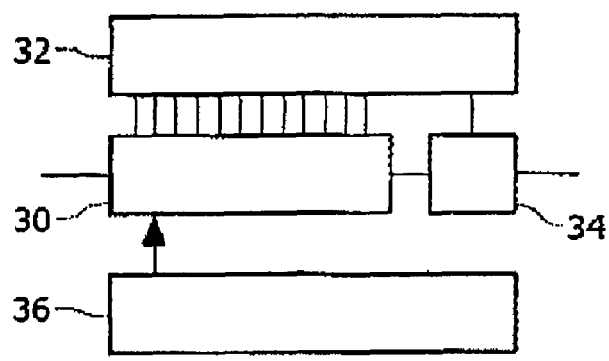
FIG. 3    UPDATE CIRCUIT
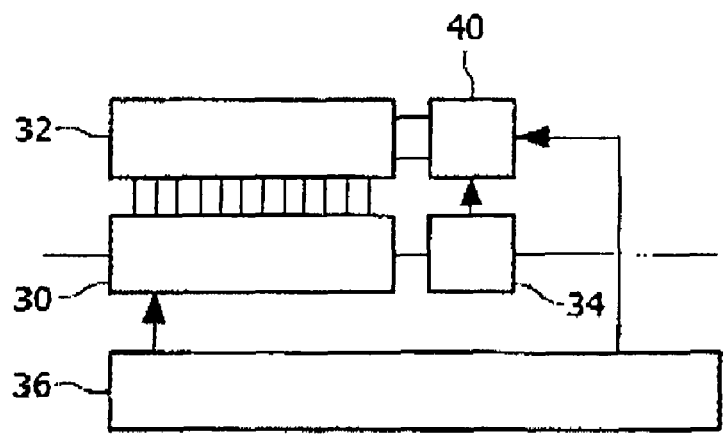
FIG. 4    UPDATE CIRCUIT
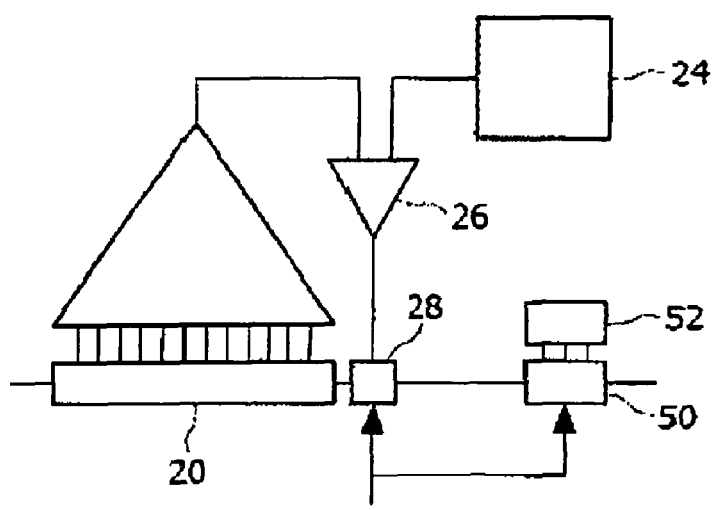
FIG. 5    SENSING CIRCUIT

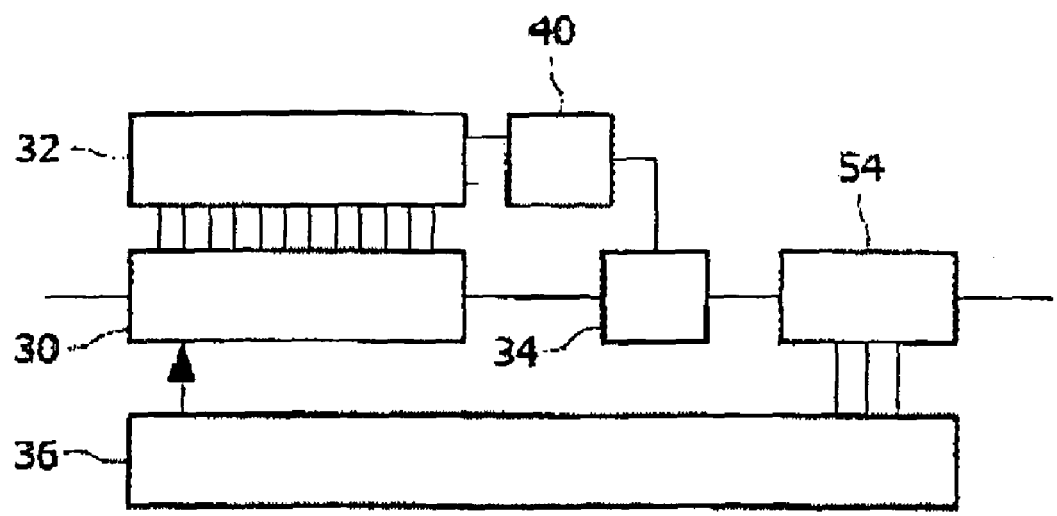
FIG. 6  UPDATE CIRCUIT
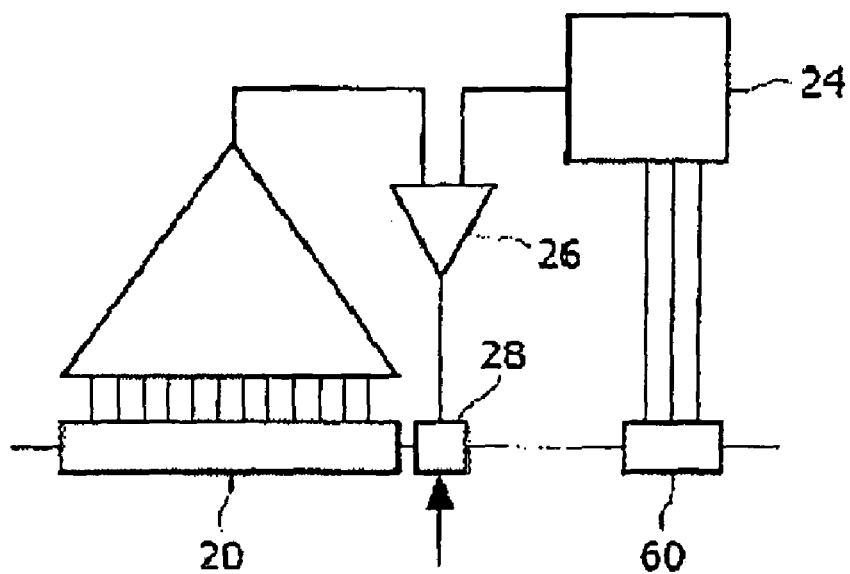
FIG. 7  SENSING CIRCUIT

MONITORING PHYSICAL OPERATING PARAMETERS OF AN INTEGRATED CIRCUIT

BACKGROUND

The invention relates to an integrated circuit and to a method of monitoring physical operating parameters of such an integrated circuit.

US Patent Application No. 2004/0128115 describes an integrated circuit with sensors for measuring the value of power supply noise. A shift register is provided to read out data from the sensors. Sensors are provided for determining a maximum power supply noise voltage and a minimum power supply noise voltage. During operation each sensor sweeps a reference voltage through a range of values until the reference voltage is found to exceed the maximum or minimum power supply noise voltage. The sensor captures digital values that represent the maximum and minimum power supply noise voltages and loads the captured digital values into the shift register. These digital values are then serially shifted out of the integrated circuit using the shift register.

PCT Patent application No 2004/068156 similarly describes capture of digital data that represents a measured physical operating parameter into a scan chain, although no voltage sweep to determine maximum and minimum voltages is mentioned. European Patent application No. 647905 describes a test circuit that performs a test by comparing voltages with reference voltage and shifts out the comparison results through a scan chain.

With the continual increase in circuit complexity there is a need to increase the number of sensing circuits for sensing physical parameters in an integrated circuit. It is desirable to measure physical operating parameters such as temperature and power supply noise, cross-talk clock jitter at many different places in an integrated circuit, in order to monitor whether the integrated circuit functions properly. However, for the function performed by the integrated the sensing circuits for these physical operating parameters are valueless overhead. Therefore it is desirable to minimize the circuit area occupied by the sensing circuits.

SUMMARY

Among others, it is an object of the invention to reduce the amount of circuit area used for sensing circuits for physical operating parameters of an integrated circuit.

Among others, it is an object of the invention to provide for sensing circuits that are capable of measuring values of physical operating parameters in an integrated circuit using a small amount of circuit area.

An integrated circuit according to the invention is set forth in Claim 1. In the integrated circuit A/D conversion (Analog to Digital conversion) by means of successive approximation is used to obtain digital numbers that represent measured values of the physical operating parameters. A shared update circuit is used for selecting the successive approximations for a plurality of sensing circuits successively. The sensing circuits and the update circuit are coupled by a serial shift register circuit for exchanging successive approximations and detection results.

Successive approximation per se is well known as an A/D technique. An example of an A/D conversion circuit that uses successive approximation uses a D/A (digital to analog) conversion circuit and a comparator for producing a detection result that indicates whether the analog output signal of the D/A conversion circuit that is obtained for a digital approximation is higher or lower than a signal that has to be measured. An update circuit selects successive digital approximations dependent on the detection results, so that the successive approximations converge towards a digital value that results in a D/A converted value near the signal that has to be measured. A simple example of a successive approximation update scheme involves raising the digital approximation by a predetermined step as long as the detection result indicates that the digital approximation results in a D/A converted value below the signal that has to be measured. More complex successive approximation update schemes involve progressive reduction of the step size. The result of successive approximation is a digital number that represents a value of the physical operating parameter equals the actual physical parameter value within a precision that is achievable given the available number of bits and/or given the number of successive approximation steps and/or fluctuations in the parameter itself. When equality within such a precision is achieved the digital number is said to substantially equal or approximate the physical operating parameter. Exact equality is generally-impossible.

In an A/D converter that uses successive approximation the update circuit that selects the successive approximations occupies a considerable circuit area. According to the invention the circuit area needed for a plurality of sensing circuits is reduced by sharing the update circuit via a serial shift register circuit. Preferably, a scan chain that is included in the integrated circuit for providing test access is used to exchange successive approximations and detection results between the sensing circuits and the update circuit. This minimizes circuit overhead. The scan chain and sensing circuits need to be provided anyway if the integrated circuit supports a test wherein physical operating parameters are compared with externally supplied reference values. By adding a shared update circuit such a structure also supports a mode of operation wherein multi-bit measurement results are obtained instead of merely comparison results.

In an embodiment the update circuit contains an adder circuit coupled to the serial shift register, to update the digital approximation by adding a sensing result controlled step number. This provides an effective update mechanism. In a further embodiment the step number may be selected from one predetermined set (from the values one an zero for example), which simplifies the update circuit. Alternatively, or in combination the available step number may be changed dependent on the successive approximation step or on the particular sensor for which the digital approximation is updated. This makes it possible to speed up convergence, or to stop when convergence has been reached.

In another embodiment the update circuit supports a plurality of types of updates, for example at least two of update by addition of a different step values, update by shifting a thermometer code (wherein the border between a string of logic ones and a string of logic zeros indicates the approximation) and update by shifting with one exceptional bit, whose position indicates the approximation. In this embodiment a control unit control which of the plurality of types of updates will be used to update for digital approximation data for respective ones of the sensing circuits. Thus, the update action of the shared update circuit can each time be made specific for the sensing circuit for which the update is made. The selection of the type of update may be performed under control of data from a memory that describes respective sensing circuits, but preferably data from the sensing circuits themselves, which is shifted to the update circuit, is used to control the type of update. In this way, no adaptations to the update circuit are needed to support different configurations of sensing circuits.

In another embodiment at least part of the sensing circuits each have a respective control input for controlling a mode of sensing of their associated parameters under control of control data from the shift register circuit. The different modes of sensing may provide for different integration periods, different sensitivities, multiplexing of different analog signals that represent different physical parameters etc. The control data may be provided from outside the integrated circuit to select the required mode of sensing for example. Preferably, the control data is circulated with the approximation-data. Typically, each sensing circuit contains a D/A conversion circuit and a comparator circuit. The D/A conversion circuit can be of any type, such as for example a conversion circuits that sums the bit values of the digital approximation, assigning different analog weights to the bit values in the sum (the weights typically being different powers of two times a basic value). Alternative types of D/A conversion include thermometer codes, wherein the each bit of the digital approximation effectively selects a different analog value. However, the invention is not limited to sensing circuits with the D/A converter-comparator structure. In other embodiments a single circuit may be used that directly produces a binary output as a function of a multi-bit digital input and a physical operating parameter. In other embodiments the detection result may contain multiple bits, for example for supplying information to speed up the approximation process.

These and other objects and advantageous aspects of the invention will be illustrated by means of non-limitative examples using the following figures

BRIEF DESCRIPTION OF THE DRAWINGS

FIG. 1 shows an integrated circuit
FIG. 2 shows a sensing circuit
FIG. 3 shows an update circuit
FIG. 4 shows an update circuit
FIG. 5 shows a sensing circuit
FIG. 6 shows an update circuit
FIG. 7 shows a sensing circuit

DETAILED DESCRIPTION

FIG. 1 shows a geographical overview of an integrated circuit with a number of circuit blocks 10 and a scan chain structure that contains shift registers 11, sensing circuits 12 and a control circuit 14 coupled in series to form a serial shift register structure. Control circuit 14 has an interface coupled to external connection terminals 16 of the integrated circuit. Only part of the circuit blocks 10 is labelled explicitly for the sake of clarity. Furthermore, functional connections between the circuit blocks, clock connections etc are not shown explicitly for the sake of clarity.

Respective sensing circuits 12 are located for example within a circuit block 10, geographically surrounded by such a circuit block or geographically adjacent to a circuit block 10. The sensing circuits 10 are designed to sense local physical operating parameters, such as local temperature in the semi-conductor body of the integrated circuit, power supply noise voltage amplitude locally on one of the power supply conductors in the integrated circuit part, cross-talk voltage amplitude at a certain position in the integrated circuit, clock jitter of a local clock signal etc. Although one sensing circuit 12 is shown for each circuit block 10, it should be realized that more than one sensing circuit may be provided for each circuit block 10, that some sensing circuits 12 may be remote from all circuit blocks 10 or that no sensing circuit may be present near some circuit blocks 10. Each sensing circuit 11 is coupled to a respective shift register 11 in the shift register structure. Most of the shift register 11-sensing circuit 12 combinations are shown as single blocks 11-12. Only part of shift registers 11 and the sensing circuits 12 is labelled explicitly.

FIG. 2 shows an embodiment of a sensing circuit 12. The circuit contains a serial shift register 20 in series with a shift register cell 28, a digital to analog conversion circuit 22 a parameter sensitive circuit 24 and a comparator 26. Serial shift register 20 has parallel outputs coupled to digital inputs of digital to analog conversion circuit 22. Comparator 26 has inputs coupled to an analog output of digital to analog conversion circuit 22 and to an output of parameter sensitive circuit 24. Comparator 26 has an output coupled to an input of shift register cell. Serial shift register 20 and shift register cell 28 form part of the shift register structure that is shown in FIG. 1.

In operation data is shifted serially through the shift register structure, so that the data also shifts through serial shift register 20. Serial shift register outputs bits of the shifted data in parallel to digital to analog conversion circuit 22. In response digital to analog conversion circuit outputs an analog signal to a first input of comparator 26. Parameter sensitive circuit 24 produces an output signal that is sensitive to a local physical operating parameter of the integrated circuit. This output signal is supplied to a second input of comparator 26. Comparator 26 outputs a binary signal that indicates whether the output signal from digital to analog conversion circuit 22 is higher or lower than the output signal from parameter sensitive circuit 24. If the output signals are voltages for example, the binary signal indicates which input of comparator 26 receives the highest voltage.

A capture control signal from control circuit 14 (not shown) signals to shift register cell 28 whether it should shift through data that has been received from the shift register structure or capture the binary data from comparator 26 and shift through the captured data instead. Subsequently the captured binary data and the data that was supplied to analog to digital conversion circuit 22 is shifted through the serial shift register structure.

Many different kinds of parameter sensitive circuit 24 may be used. Examples include a known PTAT voltage source circuit (Proportional To Absolute Temperature), a current sensing circuit that outputs a voltage proportional to a current through a power supply line, or to an average of the amplitude of such a current, an amplifier and rectifying circuit that produces an output voltage in proportion to a local noise amplitude etc. Dependent on the type of parameter sensitive circuit that is used different parameter will be measured.

FIG. 3 shows an update circuit, which is part of control circuit 14. The update circuit contains a serial shift register 30, an adder circuit 32, a shift register cell 34 and a control unit 36. Serial shift register 30 and shift register cell 34 are coupled in series and form part of the shift register structure that is shown in FIG. 1. Serial shift register 30 has inputs and outputs coupled to adder circuit 32. Shift register cell 34 has an output coupled to adder circuit 32. Control unit 36 has a control output coupled to serial shift register 30.

In operation data is shifted through the serial shift register structure into serial shift register 30 and a shift register cell 34 in the update circuit. Adder circuit 32 receives data bits from serial shift register 30 in parallel and a bit from shift register cell 34. The data bits from serial shift register 30 represent a number and adder circuit 32 forms a new number that is equal to said number or equal to said number plus one, dependent on whether the bit from shift registercell 34. Serial shift register 30 captures the new number, so that its bits replace the old number in the shift register structure in response to a signal from control unit 36.

Control circuit 14 causes data to be shifted serially through the shift register structure. Once the bit of a data value that was applied to digital to analog conversion circuit 22 and a detection result that was captured from comparator 26 have reached serial shift register 30 and shift register cell 34 respectively, control unit 36 signals serial shift register 30 to capture the new number. Adder circuit 32 is arranged so that the new number equals the old number when the bit from shift register cell 34 indicates that comparator 26 has signalled that the output signal from digital analog conversion circuit was above the output signal of parameter sensitive circuit 24. The adder circuit produces the old number plus one when the bit from shift register cell 34 indicates that comparator 26 has signalled that the output signal from digital analog conversion circuit was below the output signal of parameter sensitive circuit 24.

Subsequently the bits of the new number are shifted through the shift register structure back to shift register 20 of the sensing circuit. For this purpose control circuit 14 switches the shift register circuit to a loop operation, wherein data circulates. Once the bits of the new number have reached the sensing circuit 12 through the shift register structure an new round of sensing is performed, capturing a new binary result from comparator 26. After that the update process is repeated and so on. As a result the number in the shift register structure will ultimately assume a value that causes digital to analog conversion circuit 22 to produce an analog output signal that approximates the output signal of parameter sensitive circuit 24.

Initially, at the start of a measurement cycle control circuit 14 causes a number representing a minimum possible result (e.g. zero) to be loaded into the shift register structure.

In an embodiment all of the sensing circuits 12 have a structure as shown in FIG. 2. As a result numbers and captured comparator output signal from different sensing circuits 12 will be shifted through the update circuit of FIG. 3 successively. Each time when a number and a captured comparator output signal from a respective sensing circuit 12 are present in the update circuit control unit 36 issues a control signal to capture a new number from adder circuit 32. In this way the same update circuit performs updates for a plurality of sensing circuits 12.

Preferably control circuit is arranged so that it can be switched between a circulation mode, wherein data that is received from the shift register structure is updated and shifted back to the shift register structure, and an external mode wherein data that is received from the shift register structure is shifted out to a test data output and/or external data is shifted into the shift register structure. Mode selection by control circuit 14 may be controlled be using conventional boundary scan command techniques for example. Typically, such an interface is used to shift in test data that is applied to combinatorial circuits under test and to capture response from the combinatorial circuits and shift out these results. In one embodiment, the shift register loop that contains the sensing circuits also contains shift register cells with inputs and/or outputs for such tests, but preferably a dedicated shift register path is used for the sensing circuits, that includes substantially no register cells for other than those used for the sensing circuits and the update circuit. This allows for a faster determination of the parameter values. During measurement the control circuit switches this path so that it forms a shift register loop, but prior to measurement, or after, the path may be coupled to external test data input or output terminals to supply initialization data or to read out parameter values.

It should be appreciated that FIGS. 1 to 3 only show one possible embodiment.

FIG. 4 shows an embodiment of the update circuit wherein a variable step size may be used during the formation of new numbers. In the embodiment a step size selection circuit 40 has been added between shift register cell 34 and adder circuit 32. Control unit 36 has a control output coupled to step size selection circuit 40. Step size selection circuit 40 is arranged to output a multi-bit number that represents a step size that is controlled by control unit 36. Step size selection circuit 40 selects sign of the multi-bit number under control of the, comparator result from shift register cell 34, in the sense that a number representing minus the step size is output when the comparator result has one value, and plus the selected step size if the comparator result has another value.

In operation control circuit 14 initially sets the numbers in the serial shift register structure to large value, preferably substantially half the maximum number value that can be represented by the bits that are supplied to digital to analog conversion circuit 22. The initial step size is set to half that value. Subsequently, the selected number is halved for each round wherein the numbers for the various sensing circuits are updated.

As a result, a binary search is made for the approximation values. For example, if the digital number is 255 (represented by eight bits) the initial number is set to 128 and the step sizes are successively set to 64, 32, 16, 8, 4, 2 and 1. As a result the updated numbers will first be incremented or decremented by 64 dependent on whether comparator 26 indicates that the output of digital to analog conversion circuit for an input number of 128 is above or below the output of parameter sensitive circuit 24. This is repeated for successive step sizes, e.g. if after the first step the number is 128−64=64 then the updated numbers will be incremented or decremented by 32 dependent on whether comparator 26 indicates that the output of digital to analog conversion circuit for an input number of 64 is above or below the output of parameter sensitive circuit 24.

Again, in this embodiment, the updates for all sensing circuits 12 are performed successively by the same update circuit. The same step size is used for updates for all sensing circuits 12 in a round wherein the numbers for all sensing circuits 12 are updated. Next the step size is reduced and again used for updates for all sensing circuits 12 and so on.

As an alternative embodiment the step sizes may be selected independently for each sensing circuit 12. This has the advantage that the approximations for all sensing circuits need not be made simultaneously. In this embodiment the step size may be loaded into the shift register structure, read from that structure for updates, half the step size being written back to the shift register structure. Alternatively, indications of current step sizes for different sensing circuits 12 may be stored in a memory in control unit 36 and retrieved each time when an updated is needed.

This embodiment has the advantage that fewer updates are needed to find an accurate result. However, it should be appreciated that other updates schemes may be used in update circuit, such as a first number of updates by steps with halving size, followed by a series of updates with fixed steps. This is more robust against noise. As another example, updates for "thermometer" codes may be used. In this case the bits that are applied to a digital to analog conversion circuit 22 contain a string of successive bits with value one, followed by a string of bits with value zero for example, and the update involves shifting the position of the border between the two strings. As will be noted, adder circuit 32 must be replaced by a shifting circuit in this case.

FIGS. 5a,b show a sensing circuit and an update circuit of an embodiment wherein code data is transported through the shift register structure. Additional shift register cells 50 are provided in sensing circuit 12, coupled in series with shift register 20 and shift register cell 28. A code source circuit 52 is provided with an output coupled to additional shift register cells 50. In operation a predetermined code is loaded into the additional shift register cells 50 from code source circuit 52 when data is loaded from comparator circuit 26 and the code is shifted through the shift register structure with the approximated number and the comparator result. Additional shift register cells 54 are provided in the update circuit, for supplying the code to control unit 36. In this case control unit 36 may be arranged to adapt the updates dependent on the code. For example, this enables the use of sensing circuits with digital to analog conversion circuits that use different numbers of bits. In this case the code signals the number of bits and control unit 36 may adjust the step size to. the number of bits for example.

In another example additional codes may be used to select different updating schemes for different sensing circuits 12. For example one code value may indicate to control unit 36 that a binary search update scheme must be used, whereas another code value may indicate that an update scheme with a fixed predetermined step size must be used. The code values may even indicate that different number formats are involved for different sensing circuits 12, e.g. a binary number format for some sensing circuits 12 and a thermometer code for other sensing circuits. In this case, update circuits may be provided for each type of format and the code may be used to select between update circuits for different format for each sensing circuit 12.

These embodiments make it possible to combine sensing circuits 12 which use different types of input signals, e.g. with different numbers of bits for the digital to analog conversion circuit, with a shared update circuit.

FIG. 6 shows a further embodiment, wherein a sensing circuit 12 contains shift register cells 60 for applying control signal values to parameter sensitive circuit 24. In operation, control values are initially shifted into the shift register structure from control circuit 14 or from outside the integrated circuit. Each time before the output of comparator circuit 26 is sampled the control values are applied to parameter sensitive circuit 24. Parameter sensitive circuit 24 may provide for a controllable integration time, or time period wherein a maximum signal amplitude must be detected for example. In this case the control values can be used to select the integration time or time period.

Although the invention has been described for specific embodiments, it should be realized that other embodiments are possible. For example, although a circuit was shown with a separate digital to analog conversion circuit 22, parameter sensitive circuit 24 and comparator, it should be appreciated that these functions may be combined. For example, a parameter sensitive circuit may be used that assumes one of two of states dependent on a combination of digital input values and a parameter value. A flip-flop may be used for example, wherein the drive strength of one branch is controlled by the digital input signal and the drive strength of the other branch depends on the parameter.

Nor is the invention limited to a voltage comparator. For example digital to analog conversion circuit 22 may be replaced by a pulse generator circuit that generates a pulse after a delay that is controlled by the number from shift register 20, parameter sensitive circuit 24 may be a circuit that generates a pulse with a delay dependent on a physical operating parameter and comparator 26 may replaced by an arbiter circuit that detects which of its inputs first produces a pulse after the pulse generator circuit and parameter sensitive circuit 24 have been started in synchronism.

In another embodiment multi-bit output comparator circuits 26 may be used to increase the convergence speed of the successive approximations. In one embodiment, the update circuit is arranged to circulate digital numbers that represent a current approximation and a step size to a sensing circuit via the shift register structure. In this embodiment the digital to analog conversion circuit is arranged to output analog values corresponding to the current approximation C and the current approximation plus or minus the step size (C+S and C−S). In this embodiment the comparator circuit outputs two bits indicating whether the output signal of the parameter sensitive circuit 24 is below C−S, between C−S and C, between and C+S or above C+S. This information is used by the update circuit to select a more accurate update. It should be appreciated that preferably a conventional scan test chain is used for shifting data and results between sensing circuits 12 and the update circuit. However, the invention is not limited to such a chain. For example, instead a chain may be used that serially shifts multi-bit words, wherein the words contain updated values and comparator results, or separate shift register structures may be used for shifting updated numbers and for shifting comparator results. The latter need not provide for recirculation from the update circuit.

The invention claimed is:

1. An integrated circuit comprising:
a successive approximation analog to digital conversion circuit, comprising a plurality of sensing circuits for sensing analog physical operating parameters of the integrated circuit that represent different characteristics of the integrated circuit and forming sensing results that indicate whether values of the analog physical operating parameters are above or below reference values of parameters represented by digital approximation data, respectively, and an update circuit for making successive updates to the digital approximation data dependent on the sensing results, so that the successively updated digital approximation data converges to digital values that substantially represent the analog physical operating parameters;
a serial shift register circuit comprising serially connected shift registers, wherein the serial shift register circuit has parallel outputs coupled to the plurality of sensing circuits for supplying the digital approximation data, parallel inputs coupled to the plurality of sensing circuits for receiving the sensing results, and parallel inputs/outputs coupled to the update circuit for supplying the sensing results and updating the digital approximation data for respective ones of the sensing circuits successively, whereby the update circuit is shared by the plurality of sensing circuits using the serially connected shift registers, wherein the update circuit updates digital numbers that represent the reference values of parameters one after another dependent on respective ones of the sensing results that are formed by the plurality of sensing circuits, so that each digital number is part of a respective series of updated numbers that converges to a value that approximates a representation of a respective one of the analog physical operating parameters.

2. An integrated circuit according to claim 1, wherein the digital approximation data represents an approximation number and wherein the update circuit contains an adder circuit coupled to the serial shift register circuit, the adder circuit being arranged to add a sensing result controlled step number to said approximation number, for replacement or the digital approximation data in the serial shift register circuit by a result of the addition.

3. An integrated circuit according to claim 2, wherein the update circuit is arranged so that the sensing result selects between two predetermined step values for the sensing result controlled step number.

4. An integrated circuit according to claim 2, comprising a control unit coupled to the update circuit and arranged to select a set of step values from which the sensing result controlled step number is selected.

5. An integrated circuit according to claim 1, wherein the update circuit is arranged to support a plurality of types of updates, the integrated circuit comprising a control unit that is arranged to control which of the plurality of types of updates will be used to update digital approximation data for respective ones of the sensing circuits, the control unit selecting the type of update dependent on respective information about the respective ones of the sensing circuits.

6. An integrated circuit according to claim 5, wherein the sensing circuits are arranged to supply the respective information about the respective ones of the sensing circuits to the serial shift register circuit and wherein the control unit is arranged to obtain the respective information about the respective ones of the sensing circuits from the serial shift register circuit.

7. An integrated circuit according to claim 1, wherein at least part of the sensing circuits each have a respective control input for controlling a mode of sensing of their associated parameters, the at least part of the sensing circuits being coupled to the serial shift register circuit for controlling said mode by means of information from the serial shift register circuit.

8. An integrated circuit according to claim 1, wherein at least part of the sensing circuits each comprise a digital to analog conversion circuit, a parameter sensitive circuit and a comparator circuit with inputs coupled to outputs of the digital to analog conversion circuit and the parameter sensitive circuit, an output of the comparator circuit being coupled to the serial shift register circuit, for supplying the sensing result to the serial shift register circuit.

9. An integrated circuit according to claim 1, comprising an external connection terminal and a control circuit coupled to the external connection terminal and the serial shift register circuit, the control circuit being switchable between a circulation mode and an external access mode, the control circuit coupling data from a serial output of the serial shilft register circuit back to an input of the serial shift register circuit via the update circuit in the circulation mode, the control circuit coupling data from the external connection terminal to the input of the serial shill register circuit in the external access mode.

10. An integrated circuit according to claim 1, wherein the analog physical operating parameters sensed by respective ones of the sensing circuits include at least one of a local temperature in the integrated circuit, power supply noise strength, cross-talk strength and clock jitter.

11. An integrated circuit according to claim 1, wherein each of the sensing circuits is coupled to a shift register of the serial shift register circuit.

12. An integrated circuit according to claim 11, wherein the sensing circuits share the successive approximation update circuit through the serial shift register circuit.

13. An integrated circuit according to claim 1, wherein the analog physical operating parameters sensed by respective ones of the sensing circuits include at least one of power supply noise strength, cross-talk strength and clock jitter.

14. An integrated circuit according to claim 1, wherein the analog physical operating parameters sensed by the sensing circuits include a power supply noise strength and a cross-talk strength.

15. An integrated circuit according to claim 14, wherein the analog physical operating parameters sensed by the sensing circuits further include a clock jitter.

16. A method of measuring a plurality of physical operating parameters of an integrated circuit, the method comprising:
supplying digital numbers that represent reference values to respective sensing circuits;
using each sensing circuit to sense an analog physical operating parameter of the integrated circuit that represents a different characteristic of the integrated circuit and to detect a relative value of the sensed analog physical operating parameter relative to the respective reference value that is supplied to the sensing circuit; and
sharing a successive approximation update circuit between said sensing circuits using serially connected shift registers, for updating the digital numbers that represent the reference values one after another dependent on respective ones of the detected relative values that are detected by the sensing circuits, so that each digital number is part of a respective series of updated numbers that converges to a value that approximates a representation of a respective one of the analog physical operating parameters.

* * * * *